(12) United States Patent
Suzuki et al.

(10) Patent No.: US 8,581,186 B2
(45) Date of Patent: Nov. 12, 2013

(54) CHARGED PARTICLE BEAM APPARATUS

(71) Applicant: Hitachi High-Technologies Corporation, Tokyo (JP)

(72) Inventors: Makoto Suzuki, Hitachinaka (JP); Kazunari Asao, Naka-gun (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/767,822

(22) Filed: Feb. 14, 2013

(65) Prior Publication Data

US 2013/0206986 A1 Aug. 15, 2013

(30) Foreign Application Priority Data

Feb. 14, 2012 (JP) ................................. 2012-029057

(51) Int. Cl.
*H01J 37/256* (2006.01)
*H01J 37/26* (2006.01)
(52) U.S. Cl.
USPC ...... 250/306; 250/310; 250/311; 250/492.22; 250/492.2; 430/296; 430/942; 430/30

(58) Field of Classification Search
USPC ................. 250/306, 310, 311, 492.22, 492.2; 430/30, 296, 942
See application file for complete search history.

(56) References Cited

U.S. PATENT DOCUMENTS

| 7,087,899 | B2 * | 8/2006 | Ezumi et al. | 250/311 |
| 7,633,061 | B2 * | 12/2009 | Tanaka et al. | 250/306 |
| 8,431,897 | B2 * | 4/2013 | Shibata et al. | 250/311 |

FOREIGN PATENT DOCUMENTS

| JP | 2001-148230 A | 5/2001 |
| JP | 2001-243907 A | 9/2001 |

* cited by examiner

*Primary Examiner* — Nikita Wells
(74) *Attorney, Agent, or Firm* — McDermott Will & Emery LLP

(57) ABSTRACT

There is proposed a charged particle beam apparatus including: a plurality of noise removal filters that remove noise of an electrical signal; a measurement unit that measures the contrast-to-noise ratio after applying one of the noise removal filters; and a determination unit that determines a magnitude relationship between the contrast-to-noise ratio measured by the measurement unit and a threshold value set in advance.

9 Claims, 14 Drawing Sheets

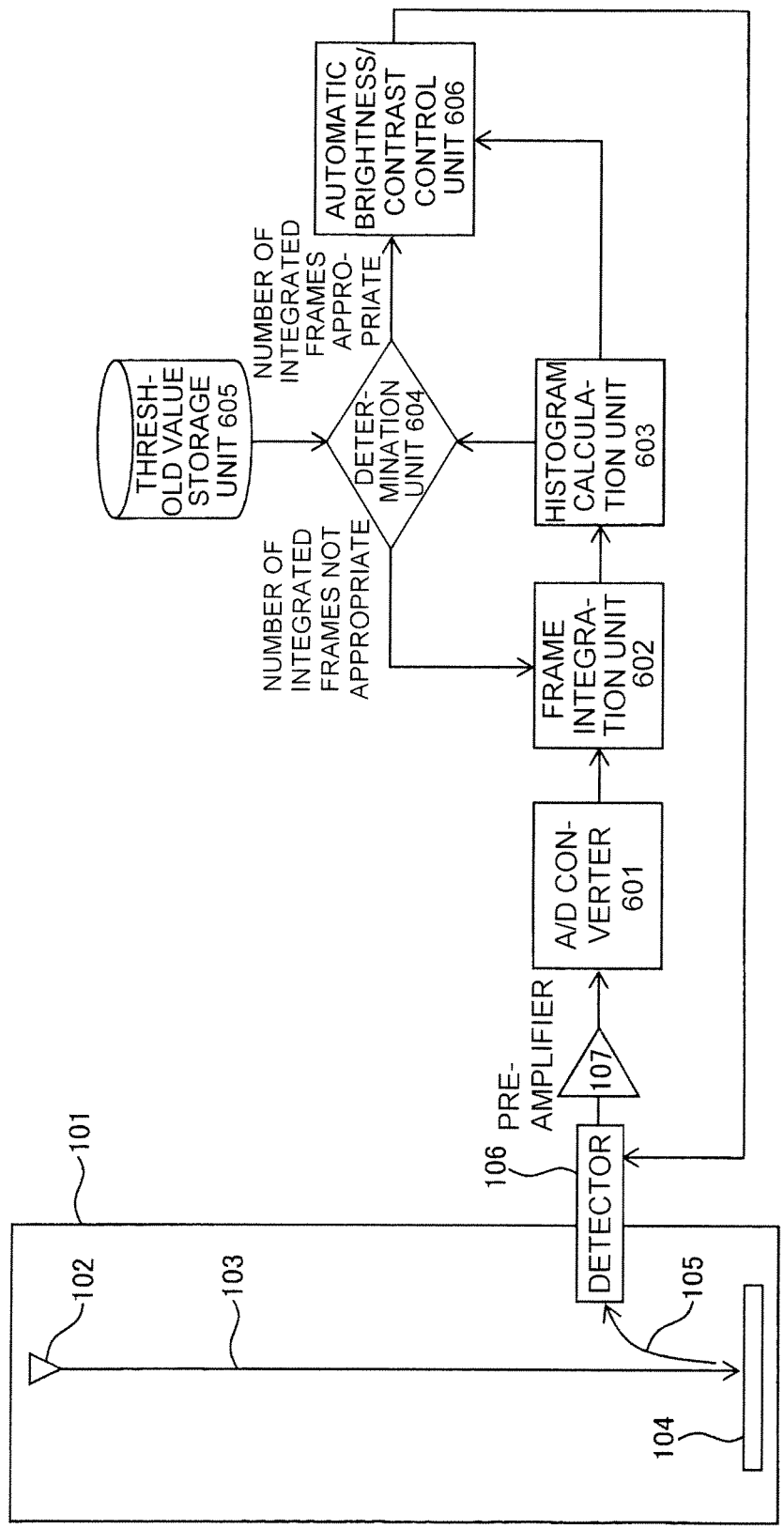

CHARGED PARTICLE BEAM APPARATUS

BACKGROUND OF THE INVENTION

1. Field of the Invention

The present invention relates to a charged particle beam apparatus and in particular, to a charged particle beam apparatus having a function of controlling the brightness or contrast of an image.

2. Background Art

As a function of automatically controlling the brightness or contrast of an image obtained by a scanning electron microscope (SEM), there is automatic brightness/contrast control (ABCC) or automatic contrast/brightness control (ACBC).

JP-A-2001-148230 discloses means for automatically controlling the brightness/contrast using the maximum and minimum values of a detected electrical signal. In addition, JP-A-2001-148230 and JP-A-2001-243907 disclose a method of automatically controlling the brightness/contrast by calculating the histogram and the cumulative frequency distribution of an image. This is a method of calculating the numerical evaluation value by appropriately processing an image and making the evaluation value converge while changing the parameters of an apparatus such that the evaluation value approaches a setting value.

When controlling the brightness/contrast automatically, it is desirable to perform pre-processing for removing noise on an image or an electrical signal. For example, in the case of control using a digital image, it is desirable to remove noise components by applying an image processing filter, such as a smoothing filter or Gaussian filter. In addition, it may be considered to remove noise by integrating a plurality of frame images obtained on the basis of multiple beam scans. In addition, in the case of control using an electrical signal, it is considered to use a low pass filter in order to remove noise components.

All of the above methods can be said to be effective techniques from the point of view of image quality improvement. As pre-processing for performing the ABCC, however, it is necessary to set the appropriate conditions in consideration of the following points.

For example, if the number of integrated frames is small, noise removal is not sufficient. On the contrary, if the number of integrated frames is large, a long time is required for image acquisition. In addition, when an image processing filter is used, for example, if the radius of a smoothing filter is small, subsequent contrast control may not be appropriately performed. If the radius of the smoothing filter is large, there is a possibility that the contrast enhancement will become excessive. In addition, if the cutoff frequency of a low pass filter is too high, contrast control may not be appropriately performed. In addition, if the cutoff frequency of the low pass filter is too low, there is a possibility that the contrast enhancement will become excessive. JP-A-2001-148230 and JP-A-2001-243907 do not disclose a method for realizing the optimization of the above pre-processing.

A charged particle beam apparatus to select appropriate pre-processing conditions when performing automatic brightness/contrast control will be described below.

SUMMARY OF THE INVENTION

In order to achieve the above-described object, according to an aspect of the invention, there is proposed a charged particle beam apparatus that irradiates a sample with charged particle beams, detects a charged particle signal generated from the sample, converts the charged particle signal into an electrical signal, and forms an image from the electrical signal. The charged particle beam apparatus includes: a plurality of noise removal filters that remove noise of an electrical signal; a measurement unit that measures a contrast-to-noise ratio after applying one of the noise removal filters; and a determination unit that determines a magnitude relationship between the contrast-to-noise ratio measured by the measurement unit and a threshold value set in advance.

In addition, in order to achieve the above-described object, according to another aspect of the invention, there is proposed a charged particle beam apparatus that irradiates a sample with charged particle beams and detects a charged particle signal generated from the sample to form an image. The charged particle beam apparatus includes: a plurality of image processing filters that remove noise of the image; a histogram calculation unit that calculates an image histogram after applying one of the image processing filters; and a determination unit that determines a magnitude relationship between a width of the histogram and a threshold value set in advance.

In addition, in order to achieve the above-described object, according to still another aspect of the invention, there is proposed a charged particle beam apparatus that irradiates a sample with charged particle beams and detects a charged particle signal generated from the sample to form an image. The charged particle beam apparatus includes: an image integration unit that acquires a plurality of frame images for the same field of view of the image and integrates the plurality of frame images; a histogram calculation unit that calculates an image histogram after integrating a plurality of frames; and a determination unit that determines a magnitude relationship between a width of the histogram and a threshold value set in advance.

According to the configuration described above, it is possible to select appropriate pre-processing conditions when performing automatic brightness/contrast control.

BRIEF DESCRIPTION OF THE DRAWINGS

FIG. 6 is a diagram showing an example of an electron microscope having an automatic brightness/contrast control function.

DETAILED DESCRIPTION OF THE INVENTION

Figure 1:
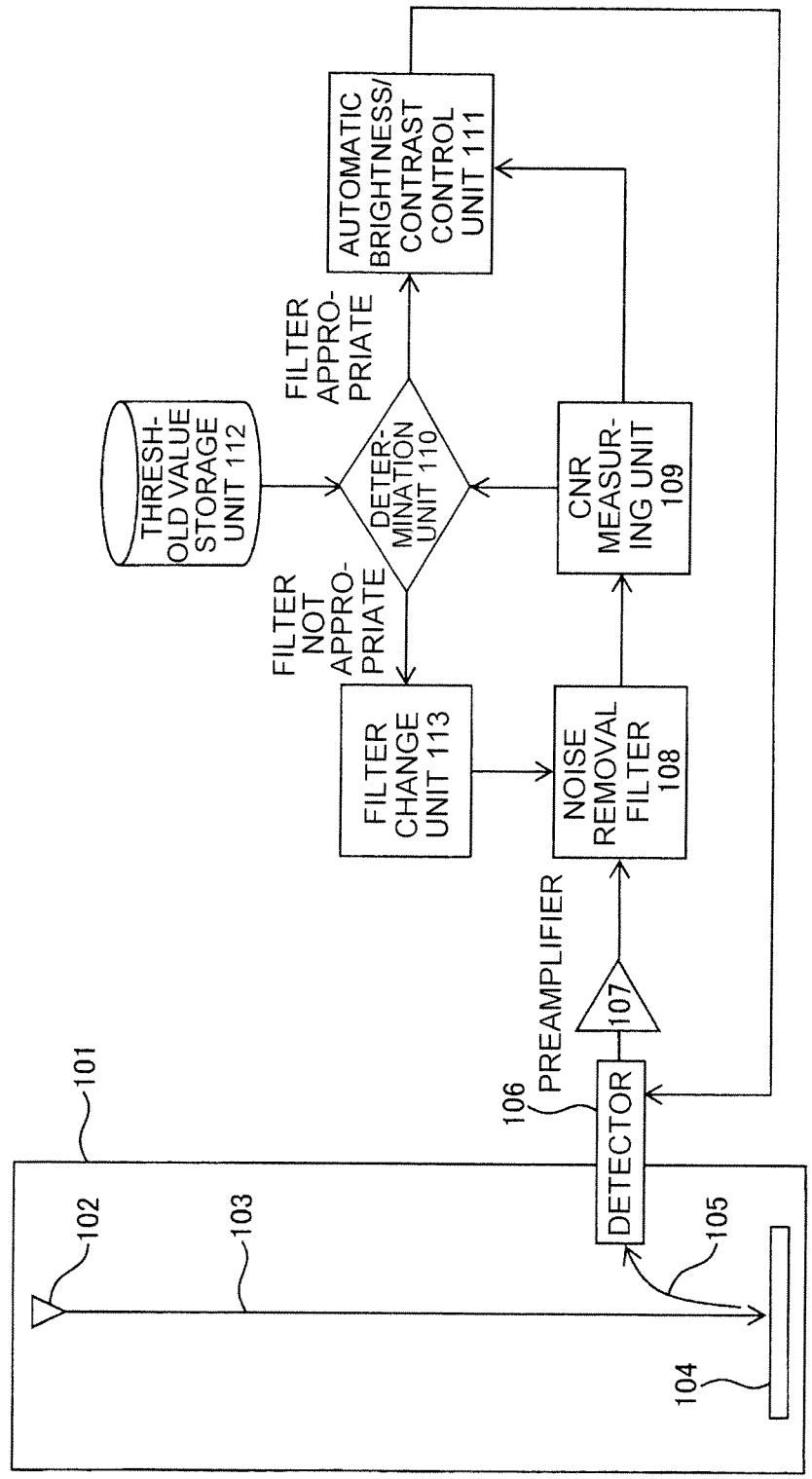
FIG. 1 is a diagram showing an example of an electron microscope having an automatic brightness/contrast control function.

In imaging using a scanning electron microscope which is a type of charged particle beam apparatus, it is important to control the brightness/contrast appropriately and use the gray scale of an image effectively. In order to realize this, there is an automatic brightness/contrast control technique. In addition, from the point of view of noise removal and the like, it is desirable to perform appropriate image acquisition, image processing, or signal processing before brightness/contrast control.

First, from the point of view of image acquisition, for example, when pattern dimension measurement or defect inspection of a semiconductor device is performed using a scanning electron microscope, the amount of electron irradiation (hereinafter, referred to as an electron dose) per unit area is set to be small in a possible range in order to minimize the effects of sample charging by electron beams. However, if the electron dose is set to be small, the signal-to-noise ratio of an image is reduced, resulting in an image with many noise components in which a sample structure cannot be seen clearly. Even if image processing or the like is performed on such an image, noise is not sufficiently removed and accordingly the brightness/contrast is not correctly controlled.

For example, when performing noise removal based on frame integration, if the number of integrated frames is small, an image in which noise is noticeable is obtained since noise removal by the integration is not sufficient. Accordingly, since the histogram spreads, contrast enhancement cannot be performed. On the other hand, if the frame integration is sufficiently performed, the histogram becomes narrow since noise is removed. This is preferable to perform contrast enhancement. However, since a longtime is required for image acquisition, observation efficiency is reduced.

In addition, for example, when performing noise removal using an image processing filter, if the radius of a smoothing filter is small, an image in which noise is noticeable is obtained since noise removal is not sufficient. Accordingly, since the histogram spreads, contrast enhancement cannot be performed. On the other hand, if the radius of the smoothing filter is large, the histogram has narrow distribution. This is preferable to perform contrast enhancement, but image blur is noticeable. In particular, since an image with high pattern density becomes an image that does not reflect a sample structure, contrast enhancement becomes excessive. Accordingly, the pixel value in the image after control is saturated.

In addition, when performing noise removal using a low pass filter, if the cutoff frequency of the low pass filter is high, an image in which noise is noticeable is obtained since the noise removal is not sufficient. As a result, since a difference between the maximum and minimum values of an electrical signal is increased, it is not possible to perform contrast enhancement. On the other hand, if the cutoff frequency is too small, the difference between the maximum and minimum values of an electrical signal is reduced, but the contrast enhancement becomes excessive. As a result, the waveform of a signal after control is saturated.

As described above, when considering not only the point of view of noise removal but also performing the ABCC, it is desirable to set the pre-processing conditions more appropriately. In other words, this indicates that there is an optimal value for the strength of "pre-processing" required to perform automatic control of the brightness/contrast (for example, the number of integrated frames, the strength of an image processing filter, or the cutoff frequency of a low pass filter) and appropriate brightness/contrast control is possible if the optimal value can be set. Since the optimal value changes with an image, it is required to perform pre-processing with the optimal value according to the image.

Hereinafter, a method of finding the appropriate pre-processing conditions for brightness/contrast control regardless of the change in the image and an apparatus to realize the method will be described.

Now, an apparatus that realizes the optimization of pre-processing of automatic brightness/contrast control in order to stably acquire an electron microscope image with good quality will be described. Specifically, a charged particle beam apparatus will be described which irradiates a sample with charged particle beams, detects a charged particle signal generated from the sample, converts the charged particle signal into an electrical signal, and forms an image from the electrical signal and which includes: a plurality of noise removal filters to remove noise of an electrical signal; an automatic brightness/contrast control unit; an CNR measurement unit that measures a contrast-to-noise ratio (CNR) after applying one of the noise removal filters; and a determination unit that determines a magnitude relationship between the CNR measured by the measurement unit and a threshold value set in advance.

In addition, an example will be described in which a determination unit that determines whether or not a noise removal filter is appropriate is provided and in which automatic brightness/contrast control is performed when it is determined that the noise removal filter is appropriate and the noise removal filter is changed when it is determined that the noise removal filter is not appropriate.

In addition, a charged particle beam apparatus will be described which irradiates a sample with charged particle beams and detects a charged particle signal generated from the sample to form an image and which includes: a plurality of image processing filters to remove noise of the image; an automatic brightness/contrast control unit; a histogram calculation unit that calculates an image histogram after applying one of the image processing filters; and a determination unit that determines whether or not an image processing filter is appropriate and that performs automatic brightness/contrast control when it is determined that the image processing filter is appropriate and changes the image processing filter when it is determined that the image processing filter is not appropriate.

In addition, a charged particle beam apparatus will be described which irradiates a sample with charged particle beams and detects a charged particle signal generated from the sample to form an image and which includes: an image integration unit that acquires a plurality of frame images for the same field of view of the image and integrates the plurality of frame images; an automatic brightness/contrast control unit; a histogram calculation unit that calculates an image histogram after image integration; a determination unit that determines whether or not the number of integrated frames is appropriate and that performs automatic brightness/contrast control when it is determined that the number of integrated frames is appropriate; and an integration number change unit that changes the number of integrated frames when it is determined that the number of integrated frames is not appropriate. In the embodiment described below, since image evaluation is performed using an image signal before performing the ABCC, it is possible to perform an appropriate evaluation based on the signal before the image state changes due to the ABCC.

As described above, by providing a determination unit that determines whether or not the "pre-processing" is appropriate, it is possible to execute optimal pre-processing to perform brightness contrast control correctly regardless of an image state. As a result, it is possible to stably acquire an electron microscope image (in the case of an ion microscope, an ion microscope image) with good quality.

First Embodiment

FIG. 1 is a diagram showing an example of an electron microscope having an automatic brightness/contrast control function. An electron source 102 is disposed in an electron microscope lens barrel 101, and an electron beam 103 is extracted from the electron source 102. A sample 104 is irradiated with the electron beam 103, and a signal electron 105 is generated from the sample 104. A detector 106 detects the signal electron and converts the signal electron into an electrical signal. The electrical signal is amplified by a preamplifier 107 to become an electrical signal with large amplitude.

When performing automatic brightness control, the electrical signal with large amplitude passes through a noise removal filter 108 to become an electrical signal from which a predetermined amount of noise has been removed. Then, for the electrical signal from which a predetermined amount of noise has been removed, the amount of contrast and the amount of noise are measured by a contrast-to-noise ratio measuring unit 109, and the contrast-to-noise ratio (hereinafter, referred to as a CNR) which is a ratio of the amount of contrast and the amount of noise is obtained. Then, a determination unit 110 compares the CNR with a CNR threshold value stored in advance in a threshold value storage unit 112. As a result of the comparison, if the CNR is larger than the CNR threshold value, automatic brightness/contrast control is performed by an automatic brightness/contrast control unit 111. If the CNR is smaller than the CNR threshold value, it is determined that the noise removal filter is not suitable. Accordingly, automatic brightness/contrast control is not performed, and the noise removal filter 108 is changed by a filter change unit 113. After changing the noise removal filter 108, the amount of noise is measured again and the same determination as described above is performed.

Although the CNR threshold value is stored in advance in the above explanation, the user may change the CNR threshold value when necessary. In addition, the user may change the CNR threshold value according to a sample to be observed. In particular, in a charged particle beam apparatus that performs inspection and measurement of a semiconductor pattern, the observed pattern can be given to the apparatus as electronic data, such as design data, CAD data, and transfer mask data. Therefore, it is also possible to set the CNR threshold value on the basis of these data items.

Figure 2:
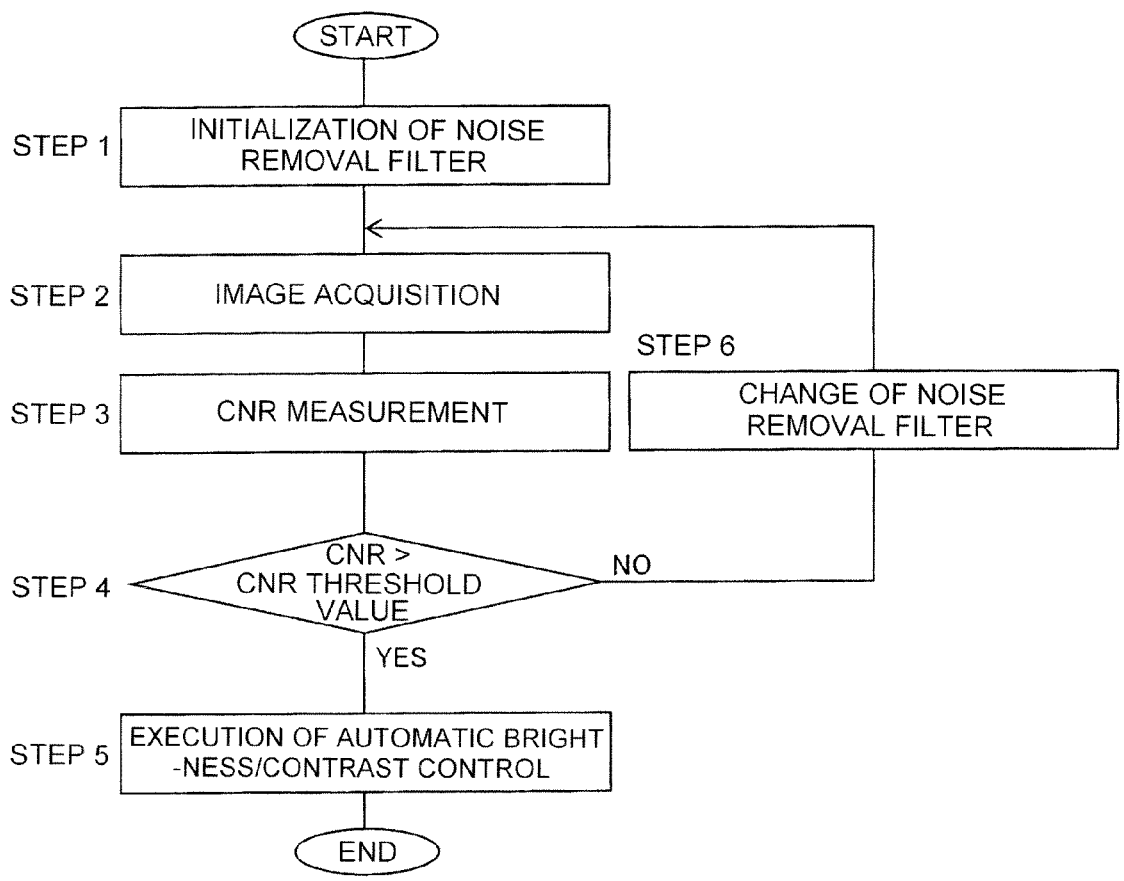
FIG. 2 is a flow chart showing the process for determining whether or not it is necessary to change a noise removal filter on the basis of contrast-to-noise ratio determination.

FIG. 2 is a flowchart showing the flow described above. First, a noise removal filter is initialized in step 1. This is an operation to select one of a plurality of prepared noise removal filters. The apparatus operator may designate the noise removal filter each time, or the noise removal filter may be determined in advance. In addition, the noise removal filter may be selected in a self-learning manner from the information of an image or the like acquired immediately before. After the noise removal filter is initialized, image acquisition is performed in step 2. Then, the CNR is measured in step 3, and determination regarding the measured CNR is performed by comparison with a CNR threshold value in step 4. As a result of the determination, if the CNR is larger than the CNR threshold value, automatic brightness/contrast control is performed in step 5. As a result of the determination, if the CNR is smaller than the CNR threshold value, the noise removal filter is changed in step 6, and the processes from step 2 are repeated.

Figure 3A:
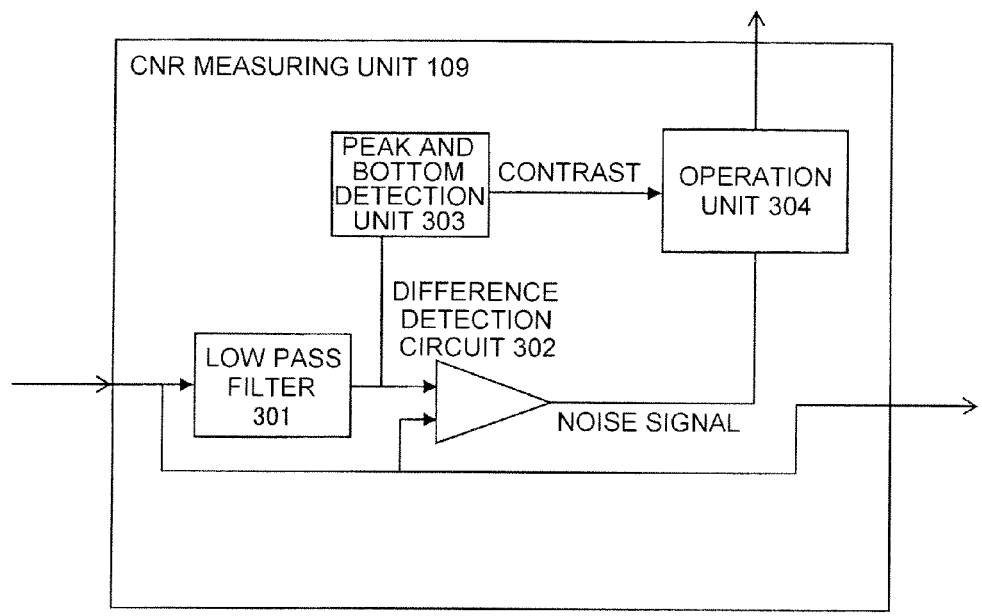
FIGS. 3A and 3B are diagrams showing an example of a contrast-to-noise ratio determination unit.
Figure 3B:
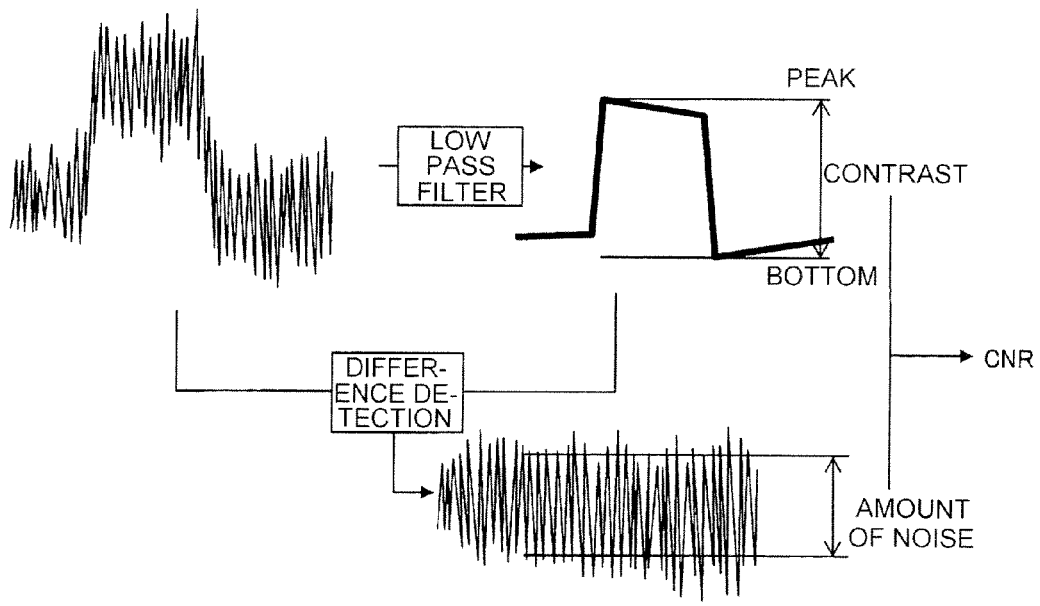

FIGS. 3A and 3B show the specific form of the contrast-to-noise ratio measuring unit 109. The electrical signal with large amplitude is input to the contrast-to-noise ratio measuring unit 109. In the contrast-to-noise ratio measuring unit 109, the electrical signal with large amplitude passes through a low pass filter 301 to become an electrical signal with less noise. Then, a difference detection circuit 302 detects a difference between the electrical signal with less noise and the electrical signal with large amplitude before passing through the low pass filter. The differential signal corresponds to the amount of noise included in the electrical signal with large amplitude. In addition, the electrical signal with less noise is transmitted to a peak and bottom detection unit 303, and the maximum and minimum values of the signal are detected. The difference between the maximum and minimum values is the amount of contrast of the electrical signal with large amplitude. The amount of contrast and the amount of noise are transmitted to an operation unit 304 to perform a division operation. As a result, the CNR is calculated.

Figure 4:
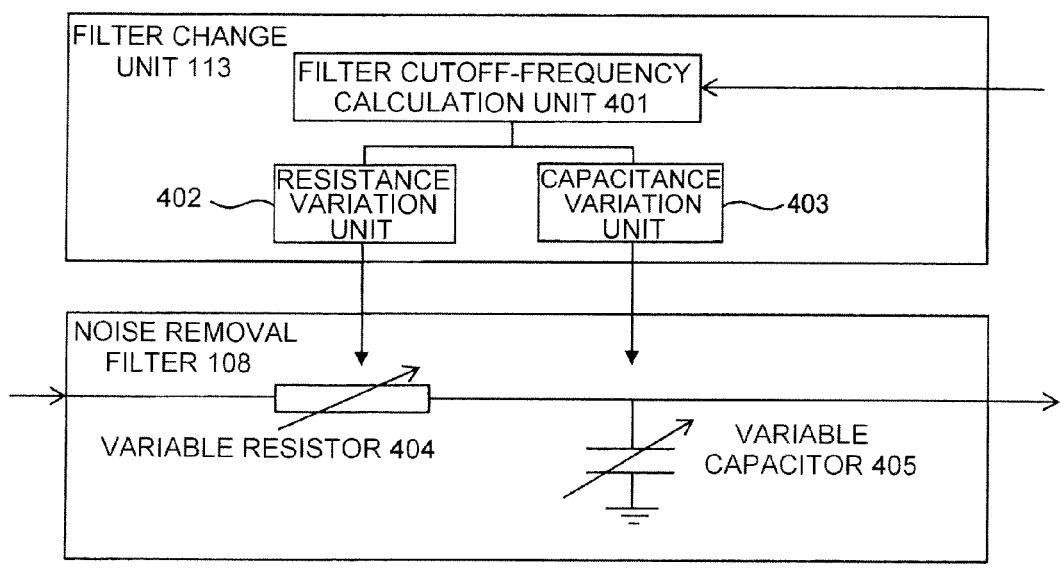
FIG. 4 is a diagram showing an example of a filter change unit.

FIG. 4 shows an example of the filter change unit 113. When the CNR value is larger than the CNR threshold value, the filter change unit 113 performs a filter change. Here, an RC low pass filter configured to include a resistor and a capacitor will be mentioned as an example of the noise removal filter 108. First, a filter cutoff-frequency calculation unit 401 calculates the resistance and the capacitance for realizing the lower cutoff frequency. According to the calculation result, a resistance variation unit 402 and a capacitance variation unit 403 change the constants of a variable resistor 404 and a variable capacitor 405 that form a noise removal filter. Here, the resistance variation unit 402 and the capacitance variation unit 403 may be motors that mechanically rotate the knob of a variable resistor or a variable capacitor, or may be an electrical relay or switching transistor for switching a plurality of resistors or capacitors. In addition, although the low pass filter is suitable as a filter for noise removal, it is also possible to use an LC filter, which is different from the above-described RC filter, or an active filter using an operational amplifier.

Figure 5A:
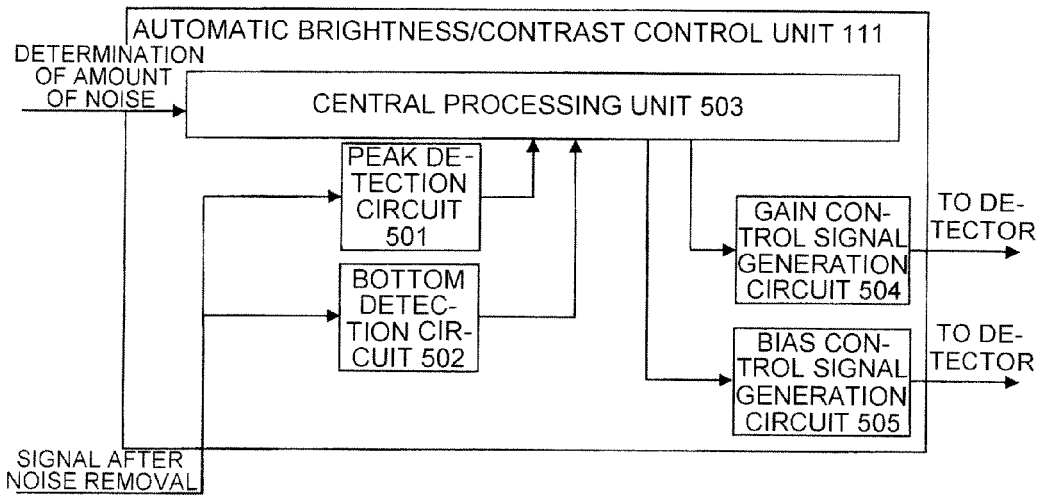
FIGS. 5A and 5B are diagrams showing an example of an automatic brightness/contrast control unit.

FIG. 5A shows a specific form of an automatic brightness/contrast control unit 111. The electrical signal from which a predetermined amount of noise has been removed is transmitted to a peak detection circuit 501 and a bottom detection circuit 502, and the maximum and minimum values of the amplitude of the electrical signal are measured. Automatic brightness/contrast control can be realized by transmitting the measured maximum and minimum values to a central processing unit 503 and appropriately controlling a gain control signal generation circuit 504 and a bias control signal generation circuit 505.

Figure 5B:
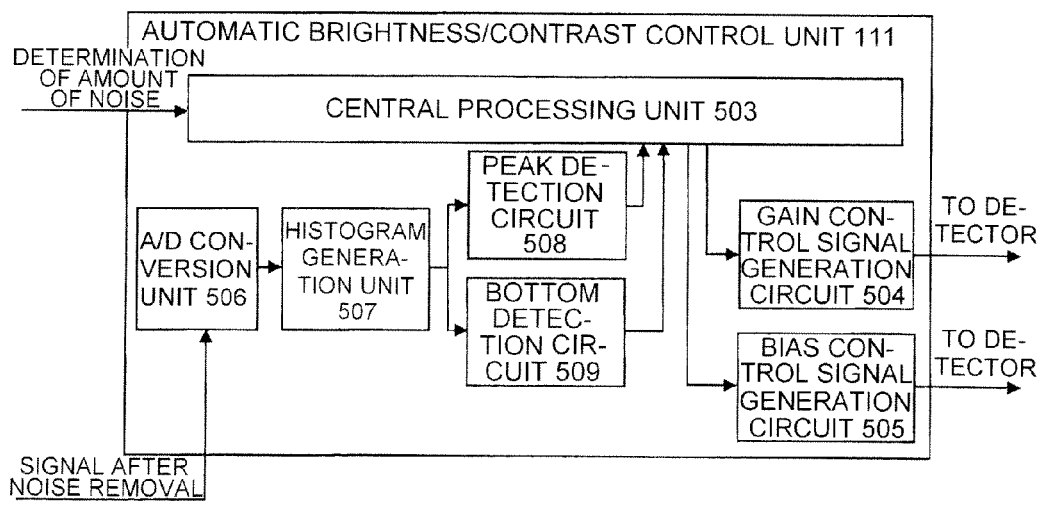

FIG. 5B shows another specific form of the automatic brightness/contrast control unit 111. The electrical signal from which a predetermined amount of noise has been removed is transmitted to an A/D conversion unit 506 so as to be converted into digital image data. The image data is converted into brightness distribution by a histogram generation unit 507. The histogram is transmitted to a peak detection unit 508 and a bottom detection unit 509, and the maximum and minimum values of the brightness or the amount of features based on the maximum and minimum values is calculated. Automatic brightness/contrast control can be realized by transmitting the calculated maximum and minimum values to a central processing unit 503 and appropriately controlling a gain control signal generation circuit 504 and a bias control signal generation circuit 505.

Second Embodiment

FIG. 6 is a diagram showing an example of an electron microscope having an automatic brightness/contrast control function. The same reference numerals are used for the same units as in FIG. 1. An electron source 102 is disposed in an electron microscope lens barrel 101, and an electron beam 103 is extracted from the electron source 102. A sample 104 is irradiated with the electron beam 103, and a signal electron 105 is generated from the sample 104. A detector 106 detects the signal electron and converts the signal electron into an electrical signal. The electrical signal is amplified by a preamplifier 107 to become an electrical signal with large amplitude. The electrical signal is transmitted to an A/D converter 601 so as to be converted into a digital image.

When performing automatic brightness/contrast control, integration processing of the digital image is performed by a frame integration unit 602. As a result, an image from which a predetermined amount of noise has been removed is obtained. Then, for the image from which a predetermined amount of noise has been removed, an image histogram is calculated by a histogram calculation unit 603. Then, a determination unit 604 determines whether or not the number of integrated frames is appropriate. The threshold value used in the determination is stored in a threshold value storage unit 605. As a result of the determination, when it is determined that the number of integrated frames is appropriate, the automatic brightness/contrast control is performed by an automatic brightness/contrast control unit 606. As a result of the determination, when it is determined that the number of integrated frames is not appropriate, it is determined that the number of integrated frames is not sufficient. Accordingly, the automatic brightness/contrast control is not performed, and frame integration is further applied for the image, from which a predetermined amount of noise has been removed, by the frame integration unit 602. The image which has passed through the frame integration unit 602 again is transmitted to the histogram calculation unit 603 to repeat the same determination as described above.

Figure 7:
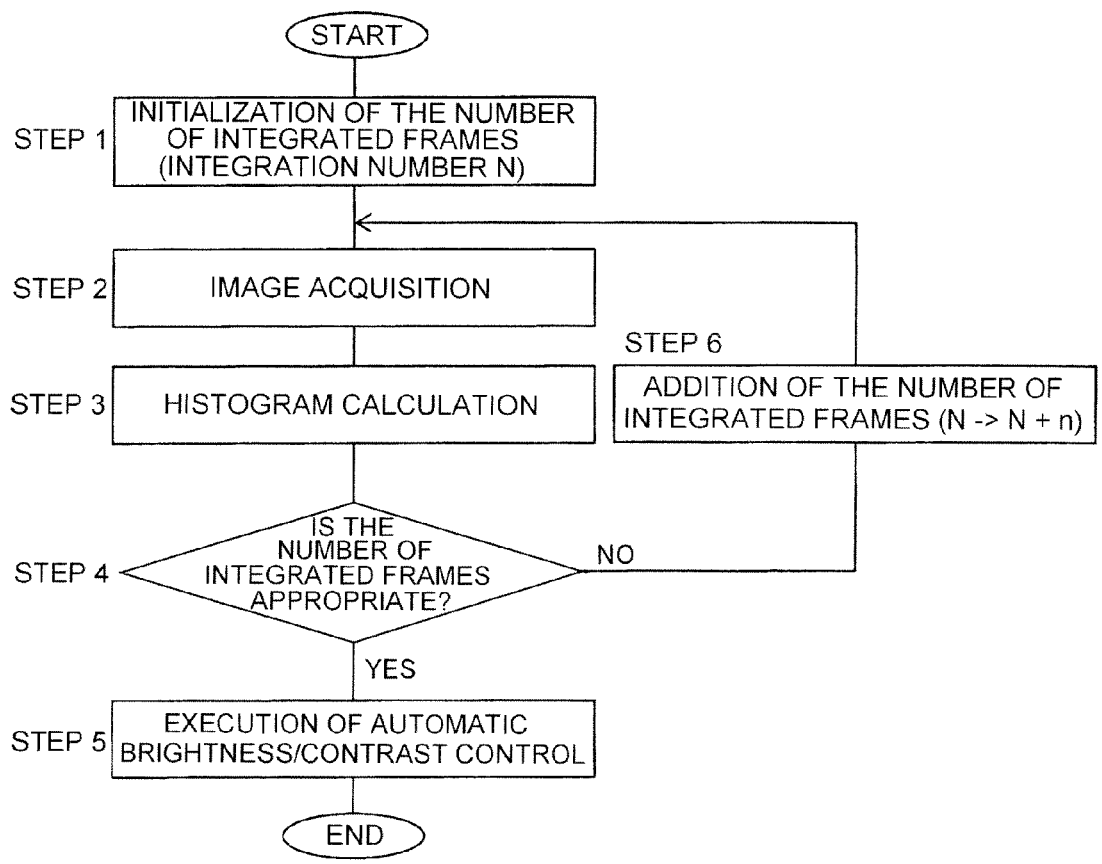
FIG. 7 is a flow chart showing the process for determining whether or not it is necessary to change the number of integrated frames on the basis of determination of a histogram of an image.

FIG. 7 is a flowchart showing the flow described above. First, the initial value (N) of the number of integrated frames is set in step 1. As the setting method, the apparatus operator may designate the initial value each time, or the initial value may be set in advance. In addition, the initial value may be selected in a self-learning manner from the image information or the like acquired immediately before. After the number of integrated frames is initialized, image acquisition is performed in step 2. Then, a histogram is calculated in step 3, and determination regarding the number of integrated frames is performed in step 4. As a result of the determination, if the number of integrated frames is appropriate, the automatic brightness/contrast control is performed in step 5. As a result of the determination, if the number of integrated frames is not appropriate, the number of integrated frames is increased by a predetermined amount (n) in step 6, and the processes from step 2 are repeated.

Figure 8A:
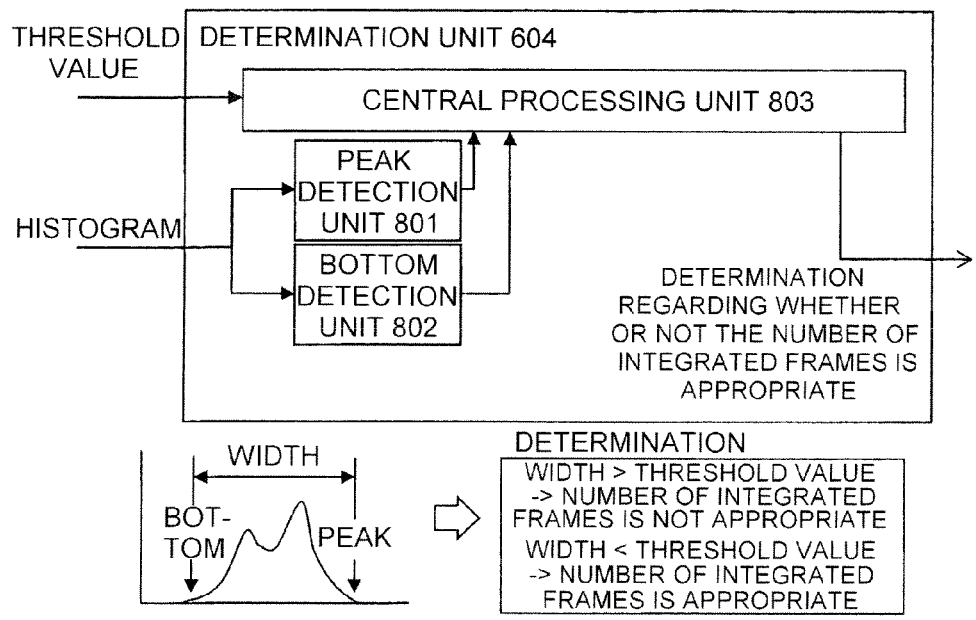
FIGS. 8A and 8B are diagrams showing an example of a determination unit that performs image histogram determination.

FIG. 8A shows an example of the specific form of the determination unit 604. The image histogram generated by the histogram calculation unit 603 is transmitted to a peak detection unit 801 and a bottom detection unit 802, and the maximum and minimum values of the brightness or the amount of features based on the maximum and minimum values is calculated. The difference between the calculated maximum and minimum values is called a width, and the width is compared with the threshold value by a central processing unit 803. If the width is larger than the threshold value, it is determined that the number of integrated frames is not appropriate. If the width is smaller than the threshold value, it is determined that the number of integrated frames is appropriate. This method is based on the fact that, in the case of an image with a large amount of noise due to the insufficient number of integrated frames, the width of the histogram is large.

In addition, although the threshold value used to determine the width of a histogram is stored in advance in the above explanation, the user may change the threshold value when necessary. In addition, the user may change the threshold value according to a sample to be observed. In particular, in a charged particle beam apparatus that performs inspection and measurement of a semiconductor pattern, the observed pattern can be given to the apparatus as electronic data, such as design data, CAD data, and transfer mask data. Therefore, it is also possible to set the threshold value on the basis of these data items.

Figure 8B:
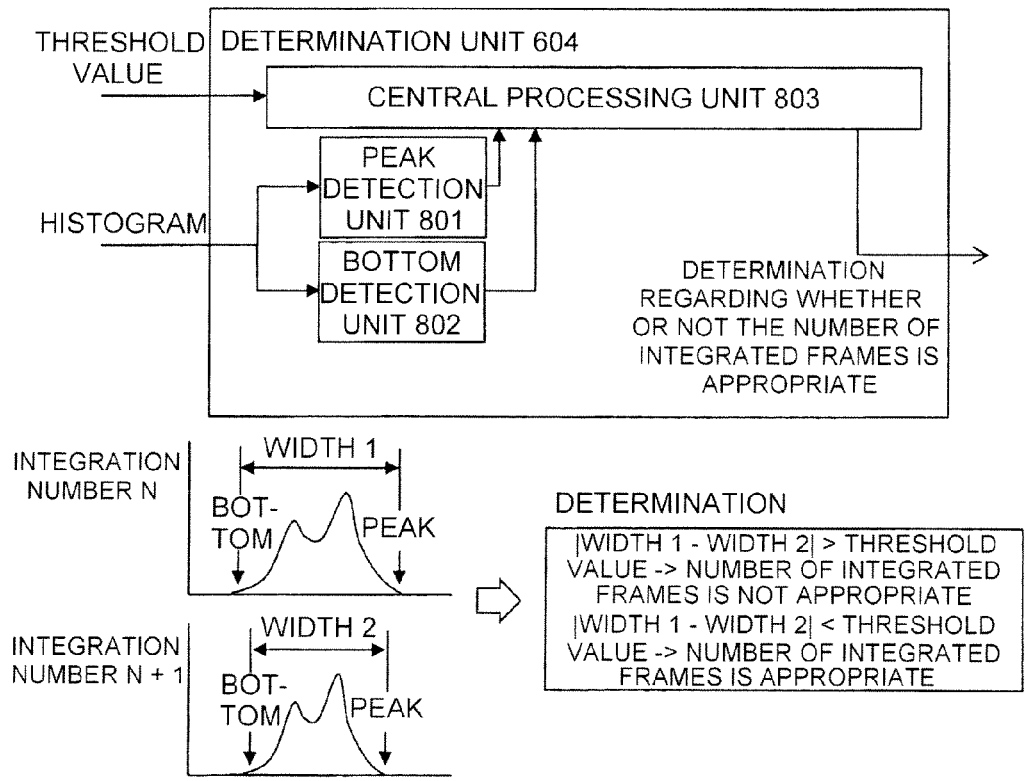

FIG. 8B shows another example of the specific form of the determination unit 604. The histogram calculation unit 603 generates an image histogram for an image acquired with the number of integrated frames N. The image histogram is transmitted to the peak detection unit 801 and the bottom detection unit 802, and the maximum and minimum values of the brightness or the amount of features based on the maximum and minimum values is calculated. The difference between the calculated maximum and minimum values is called a width 1. In addition, the same processing is performed on an image acquired with the number of integrated frames N+1, and the maximum and minimum values of the brightness or the amount of features based on the maximum and minimum values is calculated. The difference between the maximum and minimum values is called a width 2. The absolute value of the difference between the width 1 and the width 2 is compared with the threshold value by the central processing unit 803. If the absolute value of the difference between the width 1 and the width 2 is larger than the threshold value, it is determined that the number of integrated frames is not appropriate. If the absolute value of the difference between the width 1 and the width 2 is smaller than the threshold value, it is determined that the number of integrated frames is appropriate. This method is based on the fact that the histogram width of an image with a large amount of noise is clearly reduced by increasing the number of integrated frames.

Figure 9:
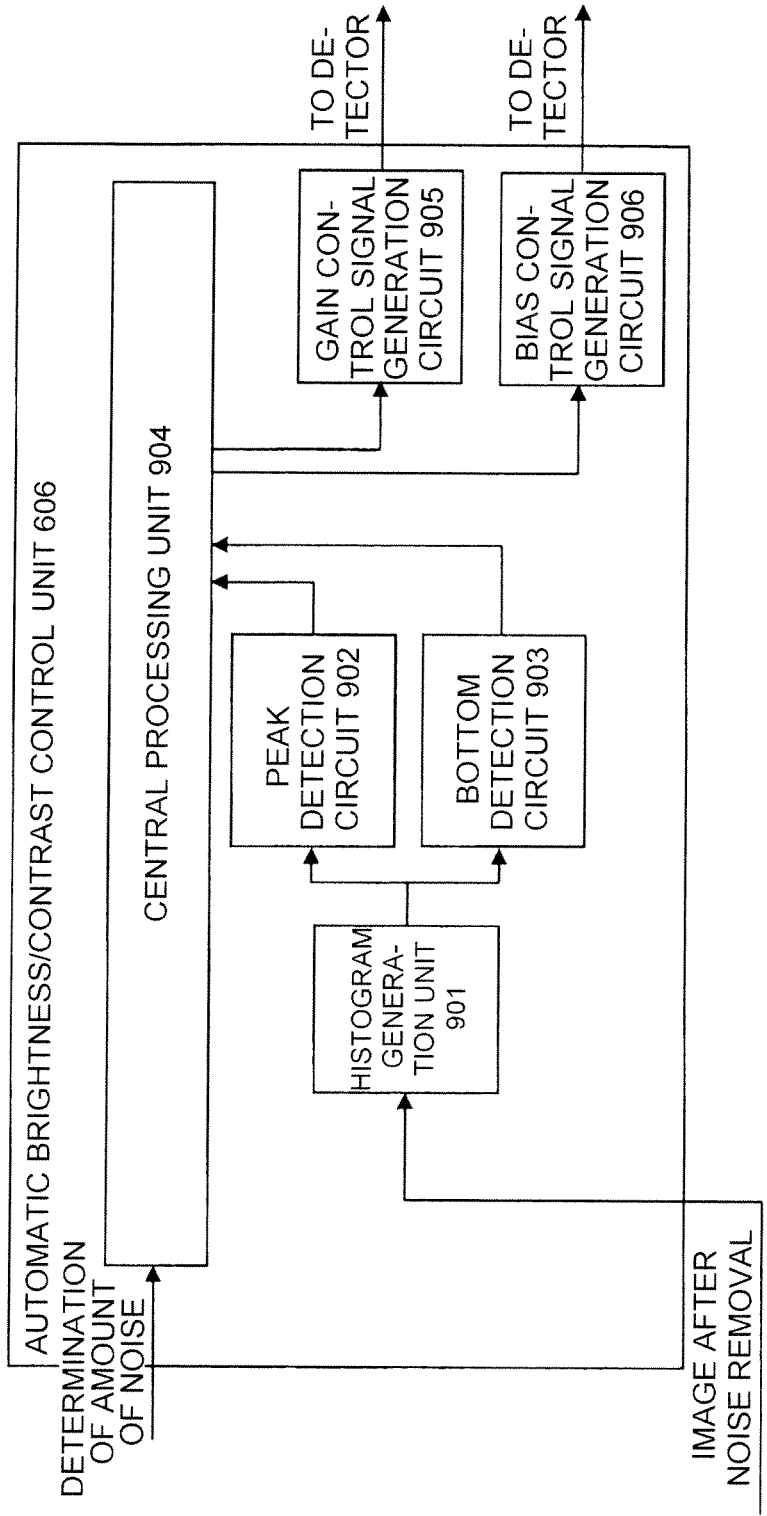
FIG. 9 is a diagram showing an example of an automatic brightness/contrast control unit.

FIG. 9 shows a specific form of the automatic brightness/contrast control unit 606. The image from which a predetermined amount of noise has been removed is transmitted to a histogram generation unit 901, and is converted into brightness distribution. The histogram is transmitted to a peak detection unit 902 and a bottom detection unit 903, and the maximum and minimum values of the brightness or the amount of features based on the maximum and minimum values is calculated. Automatic brightness/contrast control can be realized by transmitting the calculated maximum and minimum values to a central processing unit 904 and appropriately controlling a gain control signal generation circuit 905 and a bias control signal generation circuit 906.

Third Embodiment

Figure 10:
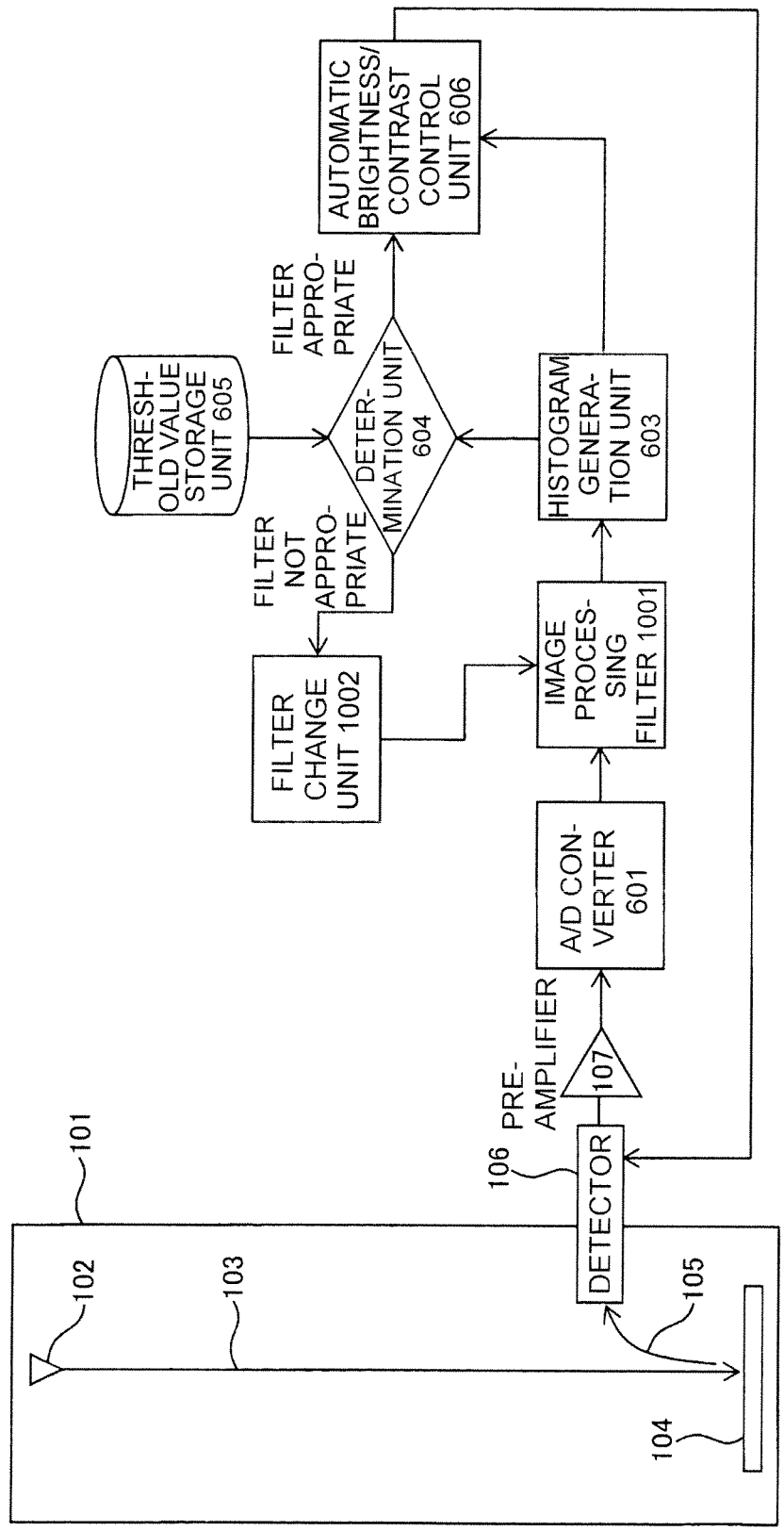
FIG. 10 is a diagram showing an example of an electron microscope having an automatic brightness/contrast control function.

FIG. 10 is a diagram showing an example of an electron microscope having an automatic brightness/contrast control function. The same reference numerals are used for the same units as in FIGS. 1 and 6. An electron source 102 is disposed in an electron microscope lens barrel 101, and an electron beam 103 is extracted from the electron source 102. A sample 104 is irradiated with the electron beam 103, and a signal electron 105 is generated from the sample 104. A detector 106 detects the signal electron and converts the signal electron into an electrical signal. The electrical signal is amplified by a preamplifier 107 to become an electrical signal with large amplitude. The electrical signal is transmitted to an A/D converter 601 so as to be converted into a digital image. The effect of the invention is most noticeable when performing automatic brightness/contrast control. When performing automatic brightness control, an image processing filter 1001 removes a predetermined amount of noise from the digital image. Then, for the image from which a predetermined amount of noise has been removed, an image histogram is calculated by the histogram calculation unit 603. Then, the determination unit 604 determines whether or not the image processing filter is appropriate.

The threshold value used in the determination is stored in the threshold value storage unit 605. As a result of the determination, when it is determined that the image processing filter is appropriate, the automatic brightness/contrast control is performed by the automatic brightness/contrast control unit 606. When it is determined that the image processing filter is not appropriate, the automatic brightness/contrast control is not performed since it is determined that the noise removal is not sufficient, and the image processing filter 1001 is changed by a filter characteristic change unit 1002. After changing the image processing filter 1001, the amount of noise is measured again and the same determination as described above is performed. A smoothing filter, such as a Gaussian filter or a median filter, is considered as the image processing filter 1001. The filter characteristic change unit 1002 performs an operation to select one of some image processing filters prepared in advance and apply it to the image. For example, in the case of a Gaussian filter, it is general to change the spread of the Gaussian distribution used in the filter.

Figure 11:
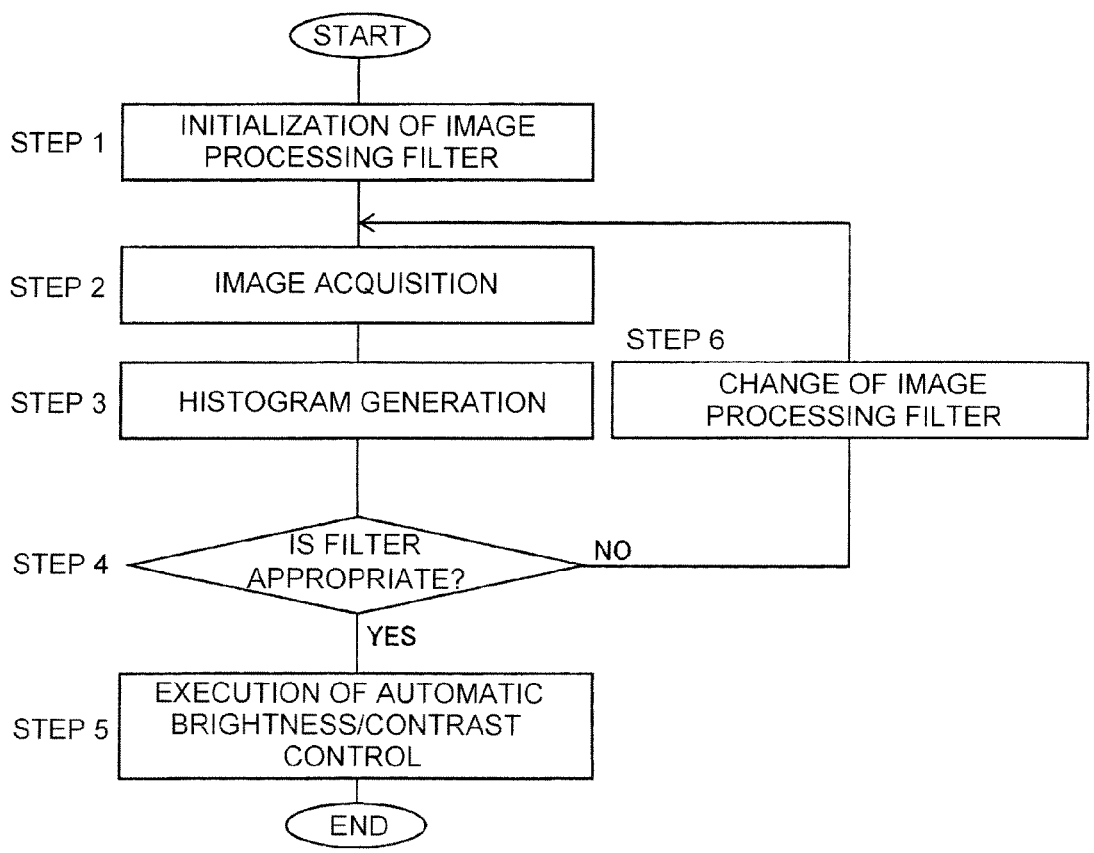
FIG. 11 is a flow chart showing the process for determining whether or not it is necessary to change an image processing filter on the basis of determination of a histogram of an image.

FIG. 11 is a flowchart showing the flow described above. First, an image processing filter is initialized in step 1. This is an operation to select one of a plurality of prepared image processing filters. The apparatus operator may designate the image processing filter each time, or the image processing filter may be determined in advance. In addition, the image processing filter may be selected in a self-learning manner from the image information or the like acquired immediately before.

After the image processing filter is initialized, image acquisition is performed in step 2. Then, a histogram is calculated in step 3, and it is determined whether or not the image processing filter is appropriate in step 4. As a result of the determination, if the image processing filter is appropriate, the automatic brightness/contrast control is performed in step 5. As a result of the determination, if the image processing filter is not appropriate, the image processing filter is changed in step 6, and the processes from step 2 are repeated. When changing the image processing filter, priorities are set in advance. For example, this is an order in which the Gaussian filter is applied if the median filter is not appropriate and then a 3×3 smoothing filter is used. Alternatively, a method may also be considered in which the filter is limited to the Gaussian filter and the initial spread of Gaussian distribution is determined and the spread is increased each time step 6 is executed. The configuration of the determination unit 604 is shown in FIGS. 8A and 8B.

Fourth Embodiment

Figure 12:
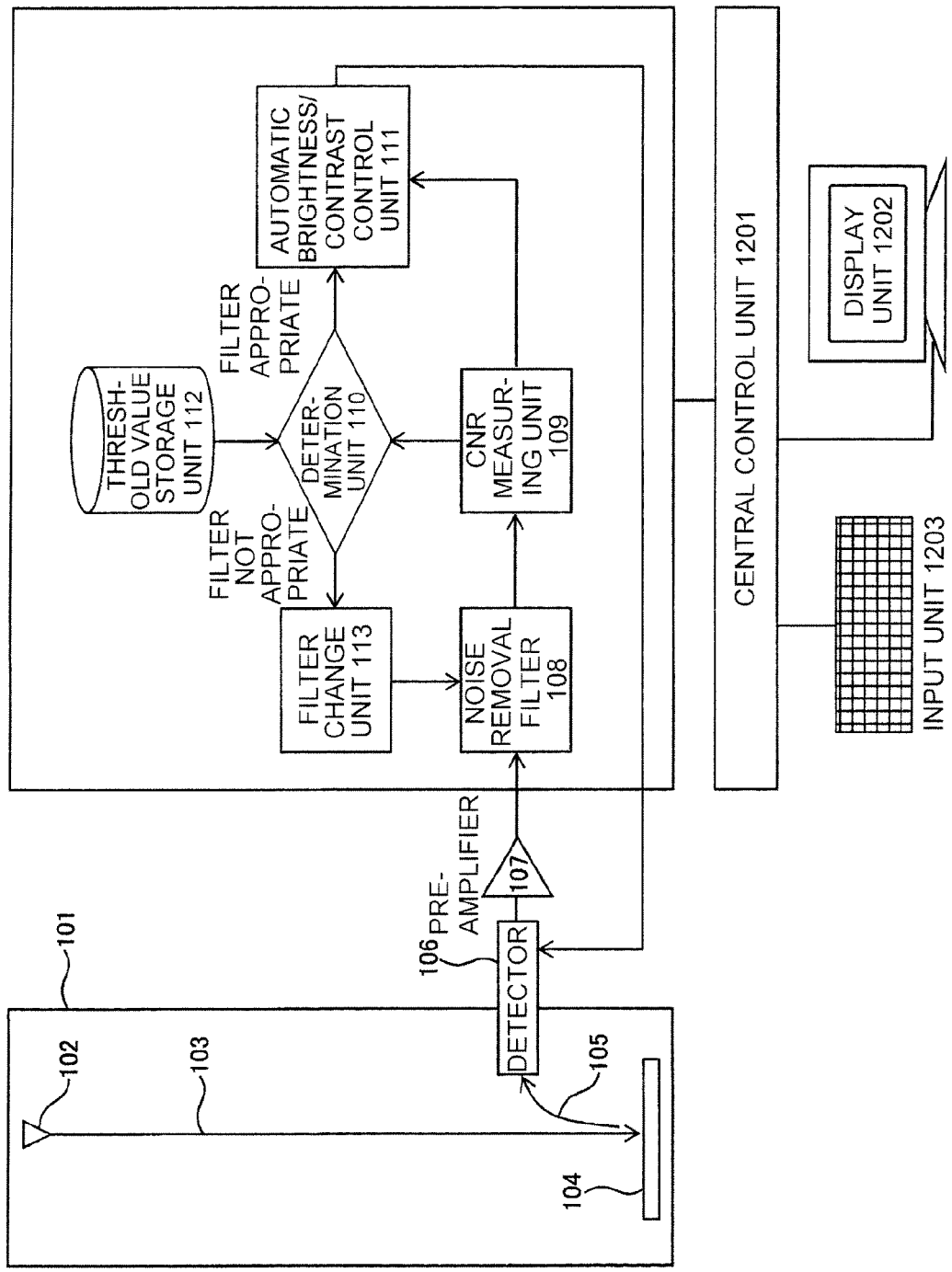
FIG. 12 is a diagram showing an example of an electron microscope having an automatic brightness/contrast control function.
Figure 13:
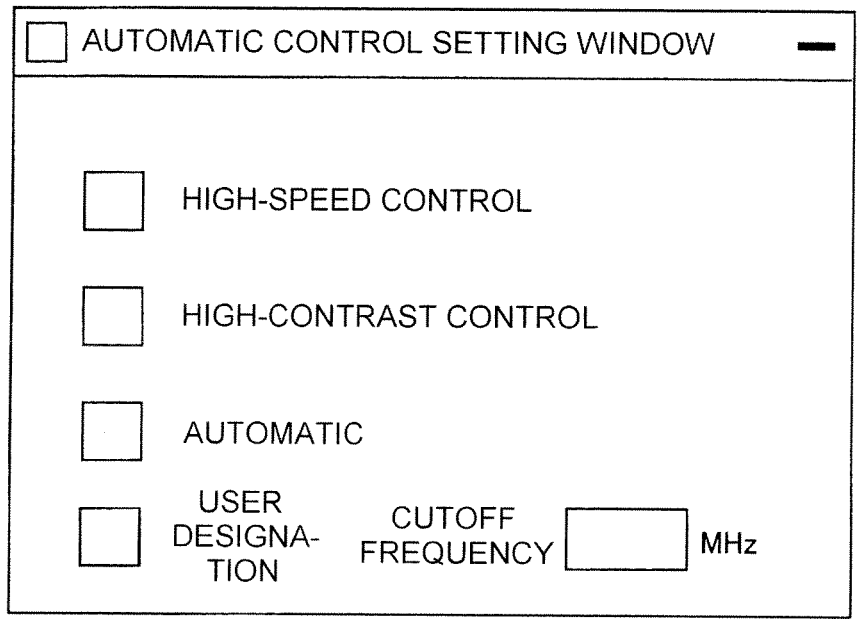
FIG. 13 is a diagram showing an example of a GUI screen having a setting window for setting the conditions of automatic brightness/contrast control.
Figure 14:
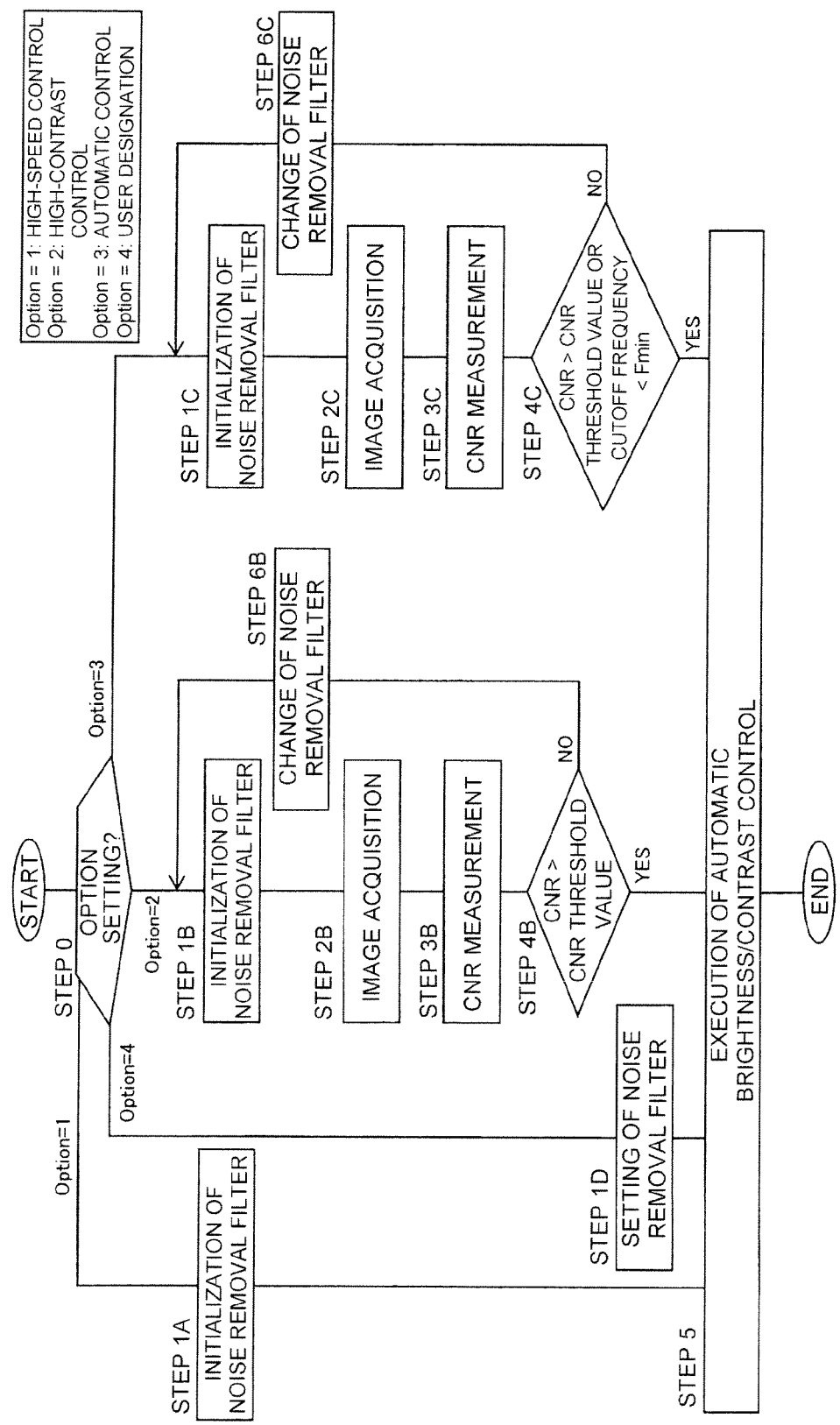
FIG. 14 is a flow chart showing the process when the automatic brightness/contrast control conditions are selected on the basis of user selection.

In the present embodiment, a charged particle beam apparatus having a function in which a user changes a setting of an automatic brightness/contrast control function will be described. FIG. 12 is a diagram showing an example of a scanning electron microscope, and FIG. 13 is a diagram showing an example of a GUI screen having a setting window for setting the conditions of automatic brightness/contrast control. The scanning electron microscope illustrated in FIG. 12 includes a central control unit 1201, a display screen 1202, and an input unit 1203 in addition to the configuration illustrated in FIG. 1. The input unit 1203 is a keyboard, a touch panel, a mouse, and the like, and the user can send an instruction to the central control unit 1201 using the input unit 1203. When a user changes a setting of the automatic brightness/contrast control function, a selection window shown in FIG. 13 is displayed on the display screen 1202. In the selection window, the user can designate whether to perform the automatic brightness/contrast control after performing pre-processing. FIG. 14 shows a flow of the automatic brightness/contrast control when certain selection is performed.

When "high-speed control" is selected in step 0, the cutoff frequency of the noise removal filter 108 is fixed to the initial value set in advance in step 1A. Then, the automatic brightness/contrast control is performed in step 5 without performing CNR measurement. In this case, since the optimization of pre-processing according to an observation sample is not realized but the pre-processing can be performed in the shortest time, it is possible to reduce the time required for observation.

When "high-contrast control" is selected in step 0, the cutoff frequency of the noise removal filter 108 is fixed to the initial value set in advance in step 1B. Then, the pre-processing is optimized as in the flowchart shown in FIG. 2 to perform the automatic brightness/contrast control. In this case, the same effect as in the first embodiment is obtained, and a high-contrast image can be acquired.

When "automatic" is selected in step 0, the cutoff frequency of the noise removal filter 108 is set to an initial value Fi, and Fmin is set as a lower limit. The cutoff frequencies Fi and Fmin may be calculated as a function of the measured density, or may be calculated from a table to assign the cutoff frequency according to the measured density. The cutoff frequency of a noise removal filter is set to Fi in step 1C. Image acquisition is performed in step 2C, and CNR measurement is performed in step 3C. Although the CNR determination is performed in step 4C, automatic control is performed if either the determination of "CNR>CNR threshold value" or the determination of "cutoff frequency<Fmin" is true. By this determination expression, the lower limit of the cutoff frequency is set, and the loop of steps 2, 3, 4, and 6 is always terminated in a limited number of times. Therefore, an image with higher contrast than when "high-speed control" is set is obtained while preventing prolonged control time.

When "user designation" is selected in step 0, the user inputs an arbitrary cutoff frequency to the text box. A noise removal filter with the input cutoff frequency is set in step 1D, and then the automatic brightness/contrast control is performed in step 5 without performing CNR measurement.

This form in which the user selects the high-speed control or the high-contrast control can be similarly applied to the charged particle beam apparatus according to the second embodiment and the charged particle beam apparatus according to the third embodiment.

What is claimed is:

1. A charged particle beam apparatus that irradiates a sample with charged particle beams, detects a charged particle signal generated from the sample, converts the charged particle signal into an electrical signal, and forms an image from the electrical signal, comprising:
   a plurality of noise removal filters that remove noise of an electrical signal;
   a measurement unit that measures a contrast-to-noise ratio after applying one of the noise removal filters; and
   a determination unit that determines a magnitude relationship between the contrast-to-noise ratio measured by the measurement unit and a threshold value set in advance; wherein the determination unit determines whether to perform automatic brightness/contrast control according to the measured contrast-to-noise ratio.

2. The charged particle beam apparatus according to claim 1, further comprising:
   a filter change unit that changes the noise removal filter,
   wherein the determination unit determines whether to perform automatic brightness/contrast control according to the measured contrast-to-noise ratio, and the filter change unit changes the noise removal filter when it is determined that the automatic brightness/contrast control is not performed.

3. The charged particle beam apparatus according to claim 2,
   wherein the measurement unit measures a contrast-to-noise ratio again after changing the noise removal filter.

4. A charged particle beam apparatus that irradiates a sample with charged particle beams and detects a charged particle signal generated from the sample to form an image, comprising:
   a plurality of image processing filters that remove noise of the image;
   a histogram calculation unit that calculates an image histogram after applying one of the image processing filters; and
   a determination unit that determines a magnitude relationship between a width of the histogram and a threshold value set in advance; wherein the determination unit determines whether to perform automatic brightness/contrast control according to the determination result.

5. The charged particle beam apparatus according to claim 4, further comprising:
   a filter change unit that changes the image processing filter,
   wherein the determination unit determines whether to perform automatic brightness/contrast control according to the determination result, and the filter change unit changes the image processing filter when it is determined that the automatic brightness/contrast control is not performed.

6. The charged particle beam apparatus according to claim 5,
   wherein the histogram calculation unit calculates an image histogram again after changing the image processing filter.

7. A charged particle beam apparatus that irradiates a sample with charged particle beams and detects a charged particle signal generated from the sample to form an image, comprising:
   an image integration unit that acquires a plurality of frame images for the same field of view of the image and integrates the frame images;
   a histogram calculation unit that calculates an image histogram after integrating a plurality of frames; and
   a determination unit that determines a magnitude relationship between a width of the histogram and a threshold value set in advance; wherein the determination unit determines whether to perform automatic brightness/contrast control according to the calculated histogram.

8. The charged particle beam apparatus according to claim 7,
   wherein the determination unit determines whether to perform automatic brightness/contrast control according to the calculated histogram, and the image integration unit changes the number of integrated frames when it is determined that the automatic brightness/contrast control is not performed.

9. The charged particle beam apparatus according to claim 8,
   wherein the histogram calculation unit calculates an image histogram again after changing the number of integrated frames.

* * * * *